United States Patent [19]
Langdon

[11] 3,729,662
[45] Apr. 24, 1973

[54] SEMICONDUCTOR RESISTOR

[75] Inventor: Jack L. Langdon, Wappingers Falls, N.Y.

[73] Assignee: International Business Machines Corporation, Armonk, N.Y.

[22] Filed: Mar. 26, 1971

[21] Appl. No.: 128,427

[52] U.S. Cl.......317/235 R, 317/235 E, 317/235 AL, 317/235 AM

[51] Int. Cl...............................................H01l 19/00

[58] Field of Search........................................317/235

[56] References Cited

UNITED STATES PATENTS

| | | | |
|---|---|---|---|
| 3,629,667 | 12/1971 | Lubart | 317/234 |
| 3,569,800 | 3/1971 | Collins | 317/235 |

OTHER PUBLICATIONS

IBM Tech. Bulletin, "Semiconductor Device with Vertical Resistor" Vol. 11, No. 11, April 1969.

*Primary Examiner*—John W. Huckert
*Assistant Examiner*—E. Wojciechowicz
*Attorney*—Hanifin & Jancin and George O. Saile

[57] ABSTRACT

A diffused resistor structure and method for fabrication which produces the resistor electrical contacts below the surface of the semiconductor device. The resistor structure includes a resistor region of a first conductivity type surrounded at the surface of the region by a region of a second conductivity. At least two spaced semiconductor electrical contacts of a first conductivity are made to the resistor region. The contacts are below the surface of the resistor structure. Electrical contacts are provided on the surface of the structure spaced from the resistor region and electrically connected to the two spaced semiconductor contacts below the surface of the resistor structure.

5 Claims, 5 Drawing Figures

INVENTOR
JACK L. LANGDON
BY George O. Saile
ATTORNEY

SEMICONDUCTOR RESISTOR

BACKGROUND OF THE INVENTION

The invention relates to semiconductor resistors which are particularly adapted to form a part of an integrated circuit.

DESCRIPTION OF THE PRIOR ART

Resistors, particularly in integrated circuits, are formed by a diffusion process and consist of an elongated semiconductor region of selected conductivity at the surface of a semiconductor wafer at the ends of which are metal layers forming electrical contacts to the resistor. The resistor region is electrically separated from the other regions containing other components by a reversed biased PN junction. The resistor is also electrically insulated at the surface by the usual insulative layer of a material such as silicon dioxide or silicon nitride. The insulator completely covers the resistor surface in all areas except where the electrical contacts are placed.

The diffusion process produces in the semiconductor resistor an impurity distribution which is highest at the surface where the impurities are first introduced into the semiconductor body and gradually diminishing toward the interior of the body. As a result of this profile of impurities, the conductivity of the resistor region will be highest at the surface of the semiconductor body. When a current flows in a resistor from one electrical contact to another, the current density will be the highest at the surface of the resistor. A consequence of this non-uniform distribution of current in the resistor is not in the areas where there are electrical contacts, there is a non-uniform distribution of current across the contact surfaces. The current is highest in that portion of each contact which is closest to the other contact. The problem of high current density in this localized area becomes more accentuated as the size of the resistor increases It has been found that discontinuities and fractures tend to arise in the metal layers forming the electrical contacts. This is believed to be caused by electromigration of the atoms of the metallic layers. Such a movement appears to result in the localized heating of the surface of the semiconductor body (relatively low conductivity) as well as from the heating of a portion of the metallic contact (relatively high conductivity) because of the high current density at that portion.

A patent application entitled "Improved Semi-conductor Resistor" by Neal D. Lubart and Madhukar B. Vora, Ser. No. 807,351, filed Mar. 14, 1969 and assigned to the same assignee as the present invention proposed a solution to the above enumerated problems The solution was to employ at least one blocking region for directing current flow. The blocking region is located between the electrical contacts to the resistor region and extends from the surface into the resistor region for a limited depth. The purpose of the blocking region is to direct the current flow in a direction more perpendicular to the contact surface and thereby improve the current distribution in the electrical contacts and semiconductor body to avoid damage to the contacts and heat up to the surface of the semiconductor resistor. The blocking regions have not fully avoided fractures and discontinuities in the metallic layers forming the electrical contacts, particularly where relatively high resistors are concerned.

SUMMARY OF THE INVENTION

An object of the present invention is to provide a new semiconductor resistor structure and its method for manufacture which does not have the failure problems of the prior art.

Another object of the invention is to provide a semiconductor resistor structure wherein the electrical contact between relatively high conductivity and relatively low conductivity regions forming the electrical contact to the resistor is at a point below the surface of the semiconductor body.

These and other objects of the invention are accomplished according to the broad aspects of this invention by providing a semiconductor resistor structure having a resistor region of a first conductivity type surrounded at the surface with a region of a second conductive. The spaced electrical contacts to the resistor regions are semiconductor contacts below the surface of the resistor structure. Electrical contacts, such as metallic ohmic contacts, are provided on the surface of the semiconductor body. These contacts are spaced from the resistor region. These metal electrical contacts are electrically connected to the semiconductor contacts within the body of the semiconductor. By this structure the high current density between high conductivity contact and the low conductivity resistor is within the body of the semiconductor and the problems of these discontinuities and fractures in the metal ohmic contacts are avoided.

DESCRIPTION OF THE PREFERRED EMBODIMENTS

Figure 1:
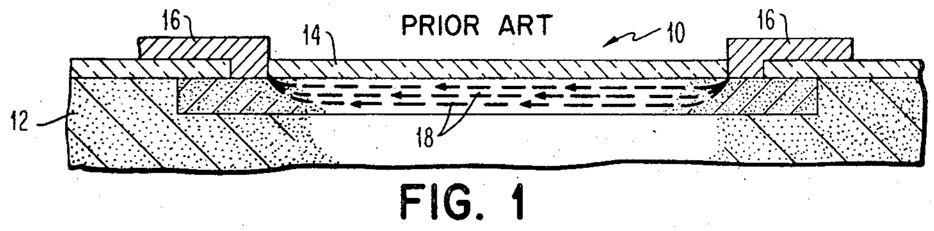
FIG. 1 shows a sectional view of a prior art semiconductor resistor.
Figure 2:
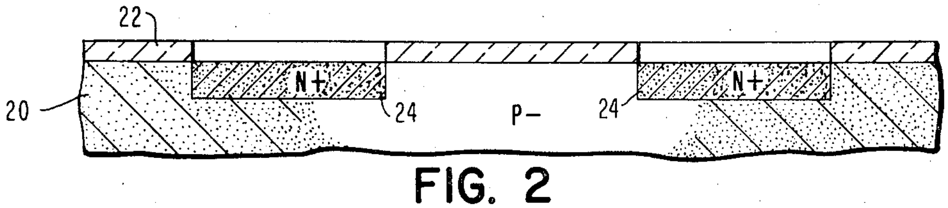
FIGS. 2, 3 and 4 show sectional views of a resistor embodiment of the present invention which illustrates the fabrication method utilized.
Figure 3:
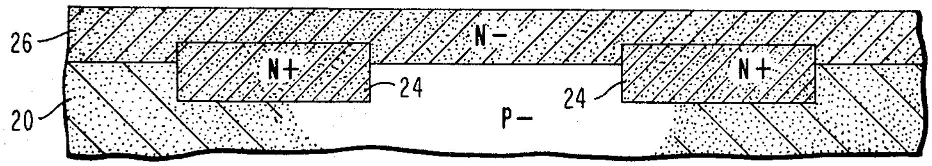
Figure 4:
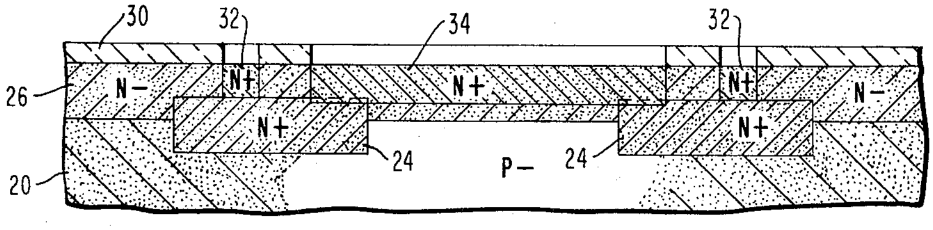

FIG. 1 illustrates an example of the prior art type of diffused semiconductor resistor. The resistor 10 is formed in the substrate 12 by the conventional thermal diffusion technique involving a thermal diffusion of impurities into the semiconductor substrate 12 through a masking film of, for example silicon dioxide. The oxide film 14 is then grown over the semiconductor region to passivate the surface of the structure. Openings are made in the passivating film 14 to the surface of the resistor where it is desired to apply the electrical contacts. Metal, such as aluminum, is then evaporated over the entire surface of the insulating and passivating film 14. A suitable photoresist is then utilized by the conventional techniques to produce the desired electrical contact configuration on the surface of the film. The metal is then etched away in areas that are not desired to produce the desired metal electrical contact patterns 16. The resulting illustrated structure produces an electrical contact which is preferably ohmic wherein there is a very high conductivity metal layer 16 in contact with a relatively low conductivity resistor region 10. This is the surface where the diffused resistors of the prior art are prone to fail. The problem is made severe by current crowding, as illustrated in FIG. 1 by the lines 18, that causes extremely high current density at the edge of the contacts closest to one another. The higher the resistor value desired the higher will be the likelihood of failure because the problem of current crowding is accentuated. This current crowding produces severe heating of the metal and semiconductor at this region which produces discontinuity fractures in the metal through mechanisms such as electromigration of the metal.

FIGS. 2 through 5 illustrate one method for manufacturing and the resulting structure of the semiconductor resistor of the present invention, which may be a portion of an integrated circuit. For the purpose of the description, a P type silicon substrate is utilized and an N type resistor is formed by the process. It is, of course, understood that the invention would also be applicable to the opposite type conductivities as well as applicable to other semiconductor materials. A suitable wafer 20 of P- is obtained with a high quality polished surface The wafer is thermally oxidized to form a layer 22. This oxidation technique may be accomplished by standard techniques involving placing the silicon body in an oxidizing atmosphere at an elevated temperature with or without the addition of water vapor to the oxidation atmosphere. A layer could alternatively be formed by other known techniques, such as pyrolytic deposition of silicon dioxide or other insulating materials. Openings in the silicon dioxide layer 22 are provided using conventional photoresist and etching technologies. A suitable etchant for silicon dioxide is an ammonium fluoride buffered solution of hydrofluoric acid. Following the etching step, all photoresist materials are removed by a suitable photoresist solvent.

An N+ impurity such as phosphorus, arsenic, antimony or the like is then diffused through the openings in the silicon dioxide layer to form the N+ diffusions 24. The diffusions may be made in the usual open tube or closed tube thermal diffusion techniques. These N+ regions 24 ultimately will become the electrical contacts to the resistor region which will ultimately be formed. The N+ regions 24 may be simultaneously formed with the subcollector diffusion for bipolar transistors where an integrated circuit having both resistors and bipolar transistors are being made simultaneously.

The silicon dioxide layer 22 is then stripped from the surface of the waver 24 by use of a buffered ammonium fluoride solution of hydrofluoric acid. An N- epitaxial layer 26 is formed on the surface of the P- substrate 20 to produce the resulting structure of FIG. 3. The N+ regions 24 in the substrate moves partially into the epitaxial layer as it is grown due to the elevated temperatures at which the epitaxial layer is grown. The epitaxial layer may be formed using the apparatus and method described in the E. O. Ernst, et. al. U. S. Pat. No. 3,424,629, issued Jan. 28, 1969.

A silicon dioxide layer may then be thermally grown on the epitaxial surface 26 using a suitable oxidizing atmosphere and temperature as described above to produce a silicon dioxide layer 30. Openings are then made in the silicon dioxide using the standard photoresist and etching process. The openings are provided where the resistor region is to be diffused into the epitaxial layer 26 and in areas spaced from the resistor region which are reach-through regions to make connection to the N+ electrical contact regions 24. Thermal N+ diffusions are then made using one of the usual N impurities such as arsenic, phosphorous or antimony to produce the reach-through regions 32 and the resistor regions 34 simultaneously or sequentially as desired. The spacing and the depth of the thermal diffusions are designed so that the reach-through N+ diffusions 32 fully contact the buried electrical contact 24 and the resistor regions 34 contact the buried electrical contact regions 24. The openings are then reoxidized by the conventional means to form a continuous silicon dioxide region over the surface of the epitaxial layer 38 and to passivate the resistor regions 34 from the atmosphere. Openings to the surface of the reach-through diffusions 32 are then made by the conventional photoresist and etching techniques. A layer of metal such as aluminum, molybdenum, titanium, chromium, platinum, palladium or the like is deposited on the surface of the semiconductor body by, for example, vacuum of operation or by sputtering techniques. The metallic layer is then selectively etched to leave conductive electrodes or areas 40. The metal electrical contacts form the surface contacts for the resistor structure. These contacts are preferably ohmic and can be formed according to the process described in the Castrucci, et al. U. S. Pat. No. 3,431,472, 3,431,47, issued Mar. 4, 1969.

Figure 5:
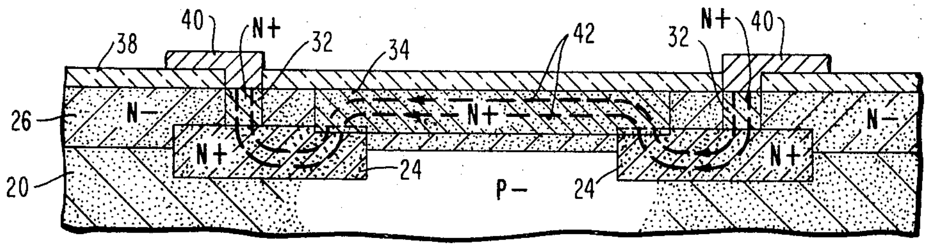
FIG. 5 is a cross-sectional view illustrating one embodiment of the invention in its final structural form.

FIG. 5 shows the final structure of the embodiment just described with the improved current distribution between the metal contacts 40 and the resistor region 34. The current distribution is schematically shown by the lines 42. This current crowding at the metal contact is significantly reduced due to the geometry of the resistor structure and due to the much lower resistivity of the N+ electrical contact regions 24 as compared to the resistivity of the resistor regions 34. Since the principal contact of high conductivity to the resistor is within the silicon body the high current density does not present the problem of the prior art. The reach-through regions 32 can be thought of as small resistors connecting the metal contact 40 with the resistors 34 through the electrical contacts 24.

The following example is included merely to aid in the understanding of the invention, and variations may be made by one skilled in the art without departing from the spirit and scope of this invention.

P- type conductivity <100> oriented silicon substrate was utilized. A silicon dioxide layer having a thickness of about 5000 A. was then thermally grown on the surface of the silicon wafer at 900°C. for 60 minutes in an oxygen and steam atmosphere. Photolithographic masking and etching techniques were used to open holes in the desired areas of the silicon dioxide layer to expose the silicon semiconductor surface. A buffered hydrofluoric acid solution was used as the etchant. The N+ regions 24 in FIG. 2 were then diffused into the silicon p− substrate using a standard arsenic closed tube diffusion process wherein a temperature of 1105°C. for 75 minutes was utilized. The resulting surface concentration was $1.4 \times 10^{21}$ atoms/cm.$^2$. The silicon dioxide layer which served as a diffusion mask during the diffusion operation was then completely removed with a buffered hydrofluoric acid solution. The silicon wafer was then placed in an epitaxial growth chamber and an epitaxial layer was grown thereon at a temperature of 1100°C. for 15 minutes having a thickness of 2 microns. The epitaxial layer resistivity was1 ohm - centimeter. The silicon wafer was then thermally oxidized to form a silicon dioxide layer on the surface of the epitaxial layer. The oxidation took place at 970°C. for 80 minutes to produce a silicon dioxide thickness of approximately 3800 A. Openings were made in he silicon dioxide layer for a junction isolation diffusion to isolate the resistors on the silicon semiconductor wafer one from another. The isolation diffusion used was a boron closed tube diffusion using a temperature of 1105°C. for 90 minutes. The junction depth was approximately 100 micro inches. The surface concentration was $4 \times 10^{20}$ atoms/cm.$^2$. Following the isolation diffusion the surface was reoxidized at 970°C. for 60 minutes to produce an oxide thickness of about 3500 A. Photolithographic masking and etching was used to open holes in the silicon dioxide layer 30 at the locations so as to allow for the subsequent formation of the resistor regions 34. The resistor diffusion was done in a closed tube phosphorus diffusion at 1050°C. for 110 minutes. The junction depth was 40 micro inches and the surface concentration was $5 \times 10^{19}$ atoms/cm.$^2$. The sheet resistivity was 72 ohms per square. A reoxidation at 970°C. for 80 minutes in steam and oxygen was then accomplished to produce an oxide thickness of about 4500 A. The reach-through contact 32 diffusion was accomplished by an arsenic capsule diffusion at a temperature of 1000°C. for 80 minutes after the appropriate opening in the oxide layer was accomplished by the usual photolithographic technique. The resulting surface concentration was $1.4 \times 10^{20}$ atoms/cm.$^2$ at a junction depth of 18 micro inches. The sheet resistivity of the contacts was 20 ohms per square. The metallization 40, shown in FIG. 5, was then formed by a deposition of platinum having a thickness of 400 A. blanketed over the entire wafer. The structure was then sintered at 500°C. for 20 to form platinum silicide where the platinum was in contact with the silicon surface. The pure platinum metal was then removed by an aqua regia etch. The terminal metallurgy of chromium-silver-chromium in the thickness ranges of 500 A. – 7000 A – 500 A. was then applied in blanket over the surface. Photolithography techniques were used to form the desired terminal metallurgy pattern on the surface of the semiconductor wafer. The resulting resistor structure was tested and proved to be a suitable resistor While the invention has been particularly shown and described with reference to preferred embodiments thereof it will be understood by those skilled in the art that the foregoing and other changes in form and details may be made therein without departing from the spirit and scope of the invention.

What is claimed is:

1. A semiconductor resistor structure comprising:

a resistor region of a first conductivity type surrounded at the surface of said structure with a region of a lower value of conductivity than said resistor region;

at least two spaced semiconductor electrical contacts of said first conductivity type to said resistor region;

said contacts being below the surface of the said resistor region and having a higher value of conductivity than said resistor region;

electrical contacts on the surface of said structure spaced from said resistor region and electrically connected to said at least two spaced semiconductor contacts.

2. The semiconductor resistor structure of claim 1 wherein said electrical contacts on the surface are metallic.

3. The semiconductor resistor structure of claim 2 wherein said metallic electrical contacts are ohmic contacts.

4. The semiconductor resistor structure of claim 3 wherein the said ohmic contacts are to diffused regions interposed between said semiconductor and said metallic contacts.

5. The semiconductor resistor of claim 4 wherein said structure includes a substrate body and an epitaxial layer thereon, and said semiconductor electrical contacts are partially within said body and said epitaxial layer.

* * * * *